United States Patent [19]

Neidorff

[11] Patent Number: 5,648,780
[45] Date of Patent: Jul. 15, 1997

[54] DIGITAL TO ANALOG CONVERTER

[75] Inventor: Robert Alan Neidorff, Bedford, N.H.

[73] Assignee: Unitrode Corporation, Merrimack, N.H.

[21] Appl. No.: 536,621

[22] Filed: Sep. 28, 1995

Related U.S. Application Data

[63] Continuation of Ser. No. 237,388, May 3, 1994, Pat. No. 5,554,986.
[51] Int. Cl.$^6$ ....................................................... H03M 1/78
[52] U.S. Cl. .......................................... 341/154; 341/145
[58] Field of Search .................................. 341/145, 146, 341/148, 153, 154

[56]     References Cited

U.S. PATENT DOCUMENTS

| | | | |
|---|---|---|---|
| 3,890,610 | 6/1975 | Cahen | 341/120 |
| 4,363,024 | 12/1982 | Brokaw | 341/154 |
| 4,580,131 | 4/1986 | Seiler | 341/153 |
| 5,455,582 | 10/1995 | Valdenaire | 341/154 |

OTHER PUBLICATIONS

Operation Manual entitled "Model KVD-700 Kelvin-Varley Voltage Divider", dated Jan. 1992, of IET Labs, Inc. 534 Main Street, Westbury, N.Y. 11590, consisting of one cover page, pp. 1-5, p. 53 and Schematic, No. KVD-700-8000, Rev. C.

*Primary Examiner*—Marc S. Hoff
*Attorney, Agent, or Firm*—Weingarten, Schurgin, Gagnebin & Hayes LLP

[57]      ABSTRACT

A multi-stage digital to analog converter with increased speed and enhanced accuracy. Multiple resistor ladders are interconnected through switches with the first resistor ladder converting the most significant bits and successive ladders converting lesser significant bits. The resistance values of the resistors of each ladder are greater than those of the preceding ladders in order to minimize inaccuracies due to loading. In one embodiment, the last resistor ladder, processing the least significant bits of the digital word to be converted, is a binary weighted resistor divider. A monolithic fabrication technique includes a common resistor biasing scheme to switch the voltage across parasitic capacitances associated with the resistors in each ladder in common mode, thereby increasing the converter speed.

14 Claims, 5 Drawing Sheets

DIGITAL TO ANALOG CONVERTER

This is a continuation of Ser. No. 237,388, filed May 3, 1994, now U.S. Pat. No. 5,544,986.

FIELD OF THE INVENTION

This invention relates generally to digital to analog converters and more particularly, to a monolithic digital to analog converter having increased speed, enhanced accuracy and reduced cost.

BACKGROUND OF THE INVENTION

Two stage cascaded converters for converting a digital word into a corresponding analog voltage are known. The first stage includes a series string, or ladder of resistors coupled across a supply voltage for dividing the voltage into a number of incremental voltages. The first resistor ladder resolves higher order bits of the digital word and the second resistor ladder resolves lower order bits. The first resistor ladder is coupled to the second resistor ladder by a plurality of switches and buffer amplifiers. Such arrangements are shown in U.S. Pat. Nos. 4,543,560 and 3,997,892. Generally, buffer amplifiers have offset voltages associated therewith and require trimming in order to obtain satisfactory conversion accuracy.

Another type of digital to analog converter utilizes a Kelvin-Varley voltage divider in which the accuracy of the conversion is dependent on the accuracy of resistor matching. More particularly, the Kelvin-Varley divider includes a plurality of resistor ladders coupled together by a plurality of switches with each of the resistors having a resistance value precisely matched to the value of the other resistors. A portion of each resistor ladder is connected in parallel with a portion of a succeeding resistor ladder and the loading of preceding ladders is critical to obtaining a desired output voltage. Also, switch resistance is critical and must be extremely low.

SUMMARY OF THE INVENTION

In accordance with the invention, a monolithic digital to analog (D/A) converter circuit includes multiple stages for converting a digital word into a corresponding analog voltage with increased speed and enhanced accuracy. Each stage of the converter includes a resistor ladder coupled to a resistor ladder of an adjacent stage through a plurality of switches. The number of resistors comprising each resistor ladder is related to the number of bits resolved by the particular stage with the first ladder resolving higher order bits and subsequent ladders resolving lower order bits.

More particularly, a first portion of the switches interconnecting adjacent resistor ladders have first terminals coupled to the first resistor ladder and second terminals coupled to a top output node of the first stage and to a top input node of the second stage. A second portion of the switches likewise have first terminals coupled to the first resistor ladder and second terminals coupled to a bottom output node of the first stage and to a bottom input node of the second stage. A decoder is provided for receiving a digital word to be converted and controlling the switches in accordance with the bits of the digital word.

The resistors of each stage have resistance values greater than the resistors of the preceding stages in order to prevent disadvantageous loading and thus, to enhance conversion accuracy. More particularly, the accuracy of the converter is enhanced without requiring the added complexity and inaccuracies associated with the use of buffer amplifiers to isolate adjacent stages. In one embodiment, the resistors of the first stage are comprised of polycrystalline silicon and the resistors of the subsequent stages are diffusion resistors.

In accordance with a further aspect of the invention, the integrated circuit resistors of each resistor ladder are biased to a common substrate which, in turn, is biased to the top output node of the preceding stage (i.e., to the top input node of the biased stage). With this arrangement, the voltage across the parasitic capacitances associated with the integrated circuit resistors is switched in common mode, thereby increasing the speed of the converter.

Also provided is a multiple stage digital to analog converter circuit in which the first stage includes a resistor ladder comprising a first plurality of series-connected resistors having matched resistance values and in which the last stage comprises a second plurality of series-connected resistors having binary weighted resistance values. The first and last stages are interconnected through a first plurality of switches and optionally through additional intermediate stages. A second plurality of switches are provided for selectively shorting resistors of the binary weighted resistor ladder in order to provide the converted analog voltage.

A decoder converts the most significant bits of the input digital word into a first plurality of switch control signals for controlling the first plurality of switches which, in one embodiment, interconnect the first and last stages. Also provided is a logic circuit for converting the least significant bits of the digital word into a second plurality of switch control signals for controlling the second plurality of switches to provide the converted analog voltage. With this arrangement, the cost of the analog to digital converter circuit is reduced. This is because use of the binary weighted resistor ladder in the last stage eliminates the need for a decoder to decode the least significant bits of the digital word.

BRIEF DESCRIPTION OF THE DRAWINGS

The foregoing features of this invention, as well as the invention itself, may be more fully understood from the following detailed description of the invention in which.

DESCRIPTION OF THE PREFERRED EMBODIMENT

Figure 1:
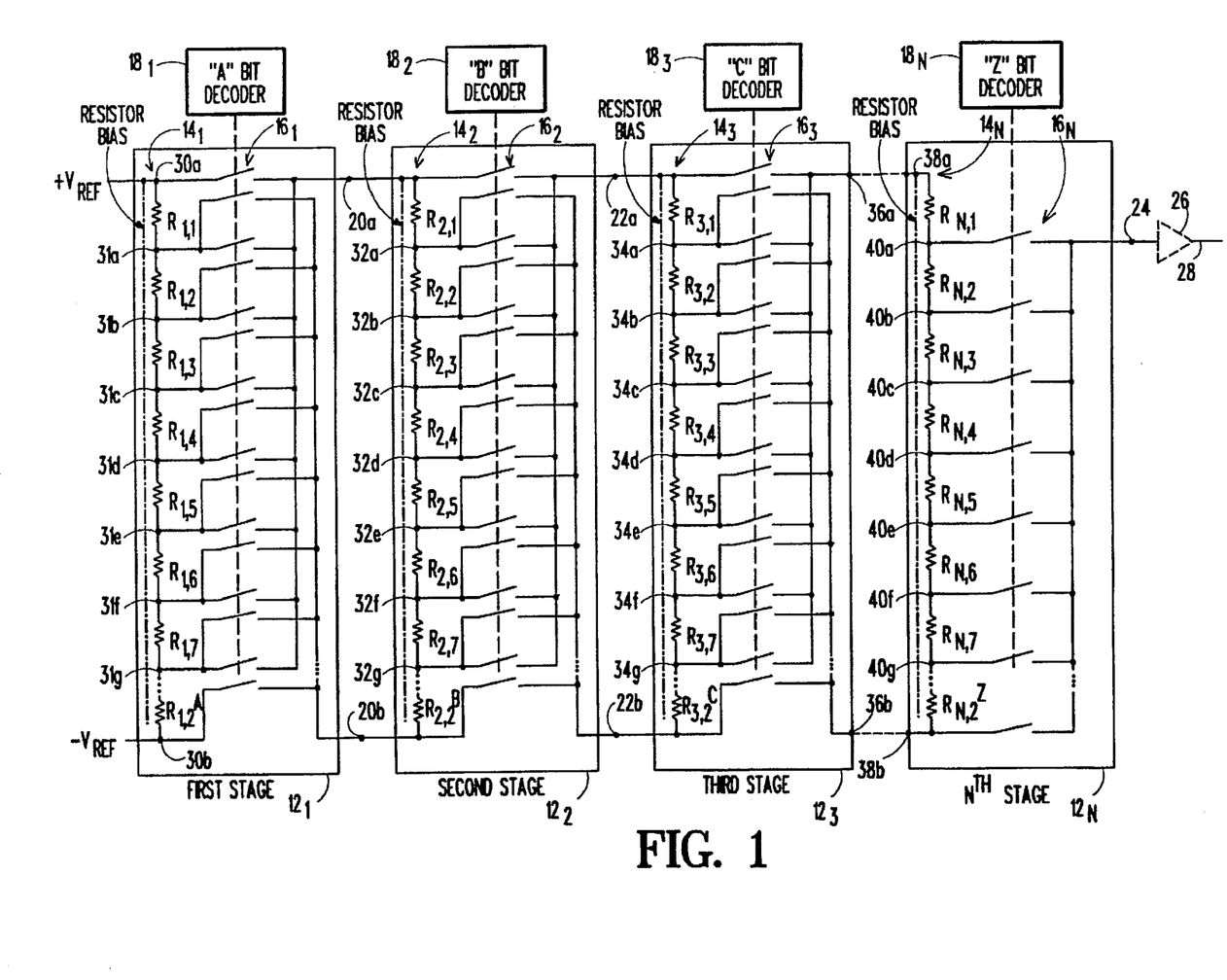
FIG. 1 is a schematic diagram of a digital to analog converter in accordance with the present invention.

Referring to FIG. 1, a digital to analog (D/A) converter is shown to include multiple stages $12_1, 12_2, \ldots 12_N$, with each stage including a resistor ladder, or divider $14_1, 14_2, \ldots 14_N$ and a plurality of switches $16_1, 16_2, \ldots 16_N$, respectively. Also associated with each stage $12_1, 12_2, \ldots 12_N$ is a decoder $18_1, 18_2, \ldots 18_N$. Each stage converts, or resolves, a predetermined number of bits of a digital word to be converted into an analog voltage, with the first stage $12_1$ resolving, "A" most significant bits, the second stage $12_2$ resolving "B" lesser significant bits, the third stage $12_3$ resolving "C" lesser significant bits, and the Nth stage $12_N$ resolving "Z" least significant bits. The number of bits resolved by each stage may or may not be the same as other stages and may be varied in accordance with a particular application. The summation of the number of bits resolved in each stage determines the number of bits of digital data conversion. For example, where the converter includes the illustrated four stages $12_1$, $12_2$, $12_3$, $12_N$ and A=B=C=Z=3, the converter is a twelve bit converter.

Each of the resistor ladders $14_1$, $14_2$, ..., $14_N$ includes a plurality of resistors coupled in series and having the same resistance value as other resistors in the same stage. The number of resistors in each stage is related to the number of bits resolved by that stage. More particularly, the number of resistors of each stage is equal to two raised to a power equal to the number of bits to be converted in that stage. Thus, the first, second, and Nth stages $12_1$, $12_2$ ... $12_N$ include $2^A$, $2^B$, and $2^Z$ resistors, respectively. For example, where A=B=C=Z=3, each resistor divider $14_1$, $14_2$, ..., $14_N$ includes $2^3$, or eight resistors, as shown.

Adjacent ones of the resistor ladders $14_1$, $14_2$ ..., $14_N$ are interconnected by a string of switches $16_1$, $16_2$, ..., $16_{N-1}$. The number of switches of each interconnecting string $16_1$, $16_2$, ... $16_{N-1}$ is $2(2^X)$, where "X" is the number of bits resolved in the preceding one of the adjacent, interconnected stages. For example, where the converter includes the illustrated four stages $12_1$, $12_2$, $12_3$, and $12_N$, (i.e., where N=4), each of the interconnecting switch strings $16_1$, $16_2$, $16_3$ includes $2(2^3)$, or sixteen switches, as shown.

Each stage $12_1$, $12_2$, ... $12_{N-1}$ has a pair of input nodes, a pair of output nodes, and a plurality of nodes between adjacent resistors of the corresponding resistor ladder $14_1$, $14_2$, ... $14_{N-1}$. For example, the first stage $12_1$ has a input nodes $30a,b$, output nodes $20a,b$, and nodes $31a-g$ between adjacent ones of the resistors $R_{1,1}-R_{1,2}{}^A$ of the ladder $14_1$. The input nodes $30a,b$ of the first stage $12_1$, are coupled across a supply voltage, labelled $+V_{REF}$, $-V_{REF}$. The input nodes $20a,b$, $22a,b$, and $38a,b$ of subsequent stages $12_2$, $12_3$, and $12_N$ are provided by the output nodes of the preceding stage and, in operation, are coupled across a portion of the resistor ladder of the preceding stage in accordance with the state of the switches of the interconnecting resistor string, as will become apparent. The last, or Nth stage differs in that the output node $24$ is single-ended and provides the converter output signal $28$, as will be discussed.

Each of the nodes between adjacent resistors in a given stage is coupled to a pair of switches, as shown. Considering exemplary first stage $12_1$ for example, each of the resistor interconnection nodes $31a-g$ is coupled to first terminals of two of the plurality of switches $16_1$. The second terminal of one such switch is coupled to the top output node $20a$ of the first stage $12_1$ and the second terminal of the other such switch is coupled to the bottom output node $20b$ of the first stage $12_1$, as shown. More particularly, a first portion of the switches $16_1$ have first terminals coupled to the first resistor ladder $14_1$ and second terminals coupled to the top output node $20a$ of the first stage $12_1$. A second portion of the plurality of switches $16_1$ have first terminals coupled to the first resistor ladder $14_1$ and second terminals coupled to the bottom output node $20b$. Subsequent stages $12_2$, $12_3$ are similarly arranged. The last, or Nth stage differs in that each resistor interconnection node $40a-g$ is coupled to only a single switch which is further coupled to the output node $24$ of the converter. An optional output buffer amplifier $26$ receives the analog voltage from the converter output node $24$ to provide an analog output voltage on output signal line $28$.

Each of the resistors $R_{1,1}-R_{1,2}{}^A$ in the first resistor ladder $14_1$ has a relatively low resistance value. The resistance values of resistors in subsequent stages $12_2$, $12_3$, ... $12_N$ are higher than those of the first resistor ladder $14_1$. Preferably, the resistors of each subsequent ladder have a higher resistance value than the resistors of the just preceding resistor ladder. This arrangement prevents undesirable loading on the preceding stages, such as may deteriorate the accuracy of the converter. In one embodiment, the resistors of the first stage $12_1$ are comprised of polycrystalline silicon and the resistors of subsequent stages $12_2$, $12_3$, ... $12_N$ are diffusion resistors, providing a higher resistance value than polycrystalline silicon resistors for the same size resistor, as will be discussed below in conjunction with FIGS. 2 and 3.

Preferably, each of the switches of switch strings $16_1$, $16_2$, ... $16_N$ has a lower resistance than the resistors in the subsequent ladder but may have a resistance comparable to that of the resistors in the preceding ladder. In this way, conversion inaccuracies due to voltage drops across the switches are avoided. For example, it is advantageous for the switches of string $16_1$ to have a resistance value lower than the resistors $R_{2,1}-R_{2,2}{}^B$ of the second stage $12_2$.

Each of the resistors of a particular stage is biased to a common substrate which in turn is biased to the voltage at the top output node of the preceding stage (i.e., the top input node of the particular stage). For example, each of the resistors $R_{2,1}-R_{2,2}{}^B$ of the resistor ladder $14_2$ of the second stage $12_2$ is biased to a substrate which in turn is biased to the voltage at the top output node $20a$ of the preceding, or first stage $12_1$. Likewise, each of the resistors $R_{3,1}-R_{3,2}{}^C$ of the resistor divider $14_3$ of the third stage $12_3$ is biased to a common substrate which in turn is biased to the voltage at the top output node $22a$ of the preceding, or second stage $12_2$. With this arrangement, the voltage across parasitic capacitances associated with each of the integrated circuit resistors of the converter is switched in common mode, thereby increasing the speed of conversion otherwise reduced by the effect of setting times associated with distributed RC time constants.

Figure 2:
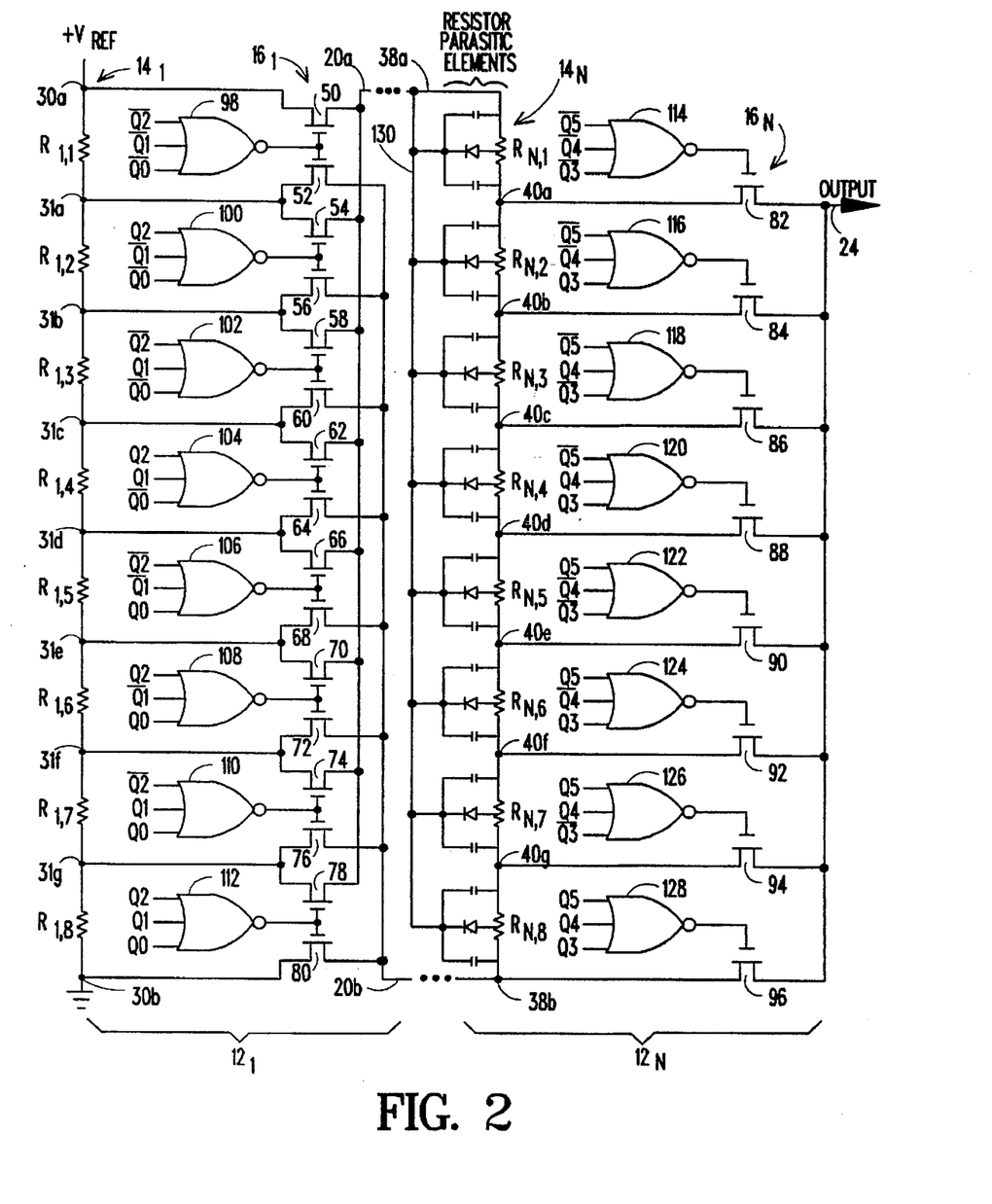
FIG. 2 is a more detailed schematic diagram of a portion of the digital to analog converter of FIG. 1.

Referring to FIG. 2, a schematic of the D/A converter of FIG. 1 is shown to include only the first and last stages $12_1$, $12_N$ for simplicity. Each of the switches $50$–$80$ and $82$–$96$ of switch strings $16_1$, $16_N$, respectively, are field effect transistors (FETs); however, other types of integrated circuit switches, such as bipolar transistors, may alternatively be used. The switches are controlled in pairs, with adjacent switches being commonly controlled by the output of a corresponding NOR gate $98$–$128$, as shown. At any given time, only one pair of adjacent switches in each ladder is closed while the remaining switch pairs are open.

The decoders $18_1$, $18_N$ (FIG. 1) associated with the stages $12_1$, $12_N$ comprise the NOR gates $98$–$112$ and $114$–$128$, respectively. Input signals corresponding to the bits to be resolved in a given stage are coupled to the NOR gates, as shown. For example, where the converter includes only two stages $12_1$, $12_N$, with each stage resolving three bits of data, three digital signals Q0–Q2 are coupled to each of the NOR gates $98$–$112$ of the first stage $12_1$ and three digital signals Q3–Q5 are coupled to each of the NOR gates $114$–$128$ of the second stage $12_N$. The bits Q0–Q2 resolved by the first stage $12_1$ correspond to the greatest significant bits of the digital word to be converted and bits Q3–Q5 resolved by the second stage $12_N$ correspond to the least significant bits of the digital word. Inversion circuitry (not shown) inverts the digital bits Q0–Q5 of the digital word to provide inverted bits $\overline{Q0}$–$\overline{Q5}$ to the NOR gates, as shown.

To illustrate the operation of the converter, consider the case where the digital word to be converted is 100010 and the reference voltage $+V_{REF}$ is +2.5 V (i.e., $-V_{REF}$ is at ground). Thus, the three greatest significant bits provide digital signals as follows: Q0=1, Q1=0, and Q2=0. With this arrangement, the output of NOR gate 104 is at a logic high state causing the corresponding switches 62, 64 to close and the outputs of all of the other NOR gates of the first stage $12_1$ are in a logic low state causing the remaining switches of the first stage $12_1$ to remain open. Thus, the top output node 20a of the first stage $12_1$ is coupled to resistor interconnection node 31c through closed switch 62 (i.e., such node 31c being at a voltage of 2.5 V*⅝=1.5625 V) and the bottom output node 20b is coupled to resistor interconnection node 31d through closed switch 64 (i.e., such node 31d being at a voltage of 2.5 V*⅜=1.25 V). Thus, the top input node 38a of the second stage $12_N$ is at 1.5625 volts and the bottom input node 38b of the second stage $12_N$ is at 1.25 volts so that the resistor divider $14_N$ of the subsequent stage $12_N$ divides the 0.3125 V thereacross into eight equal incremental voltages.

The lesser significant bits provide digital signals to the NOR gates 114–128 of the second stage $12_N$ as follows: Q3=0, Q4=1, and Q5=0. With this arrangement, the only NOR gate of the second stage gates 114–128 having a logic high output is NOR gate 124, thereby causing switch 92 to be closed. Closure of switch 92 causes the voltage at resistor interconnection node 40f (i.e., equal to 1.25+(0.3125 V*⅜) =1.328125 V) to be coupled to the output node 24 to provide the analog output voltage.

The operation of the converter is advantageously monotonic (i.e., the output signal 24 continuously increases as the digital word increases). As should be apparent from the above illustration of the converter operation, the maximum voltage swing at the output nodes 20a, b of the first stage $12_1$ having a $\pm V_{REF}$ of 2.5 volts coupled thereacross is 2.1875 V. That is, the top output node 20a can swing between 2.5 V and 0.3125 V, whereas the bottom output node 20b can swing between 2.1875 V and ground. Without the resistor biasing scheme herein provided, this voltage swing would disadvantageously reduce the speed of the converter due the effect of such voltage swing on parasitic capacitances inherent in the monolithic construction of the converter resistors. More particularly, each of the integrated circuit resistors of the converter has parasitic capacitance associated therewith, as represented by the two capacitors associated with each of the resistors $R_{N,1}$–$R_{N,8}$ of the stage $12_N$ and labelled resistor parasitic elements. The parasitic diode associated with each resistor is characteristic of diffusion resistors, as described below.

Figure 3:
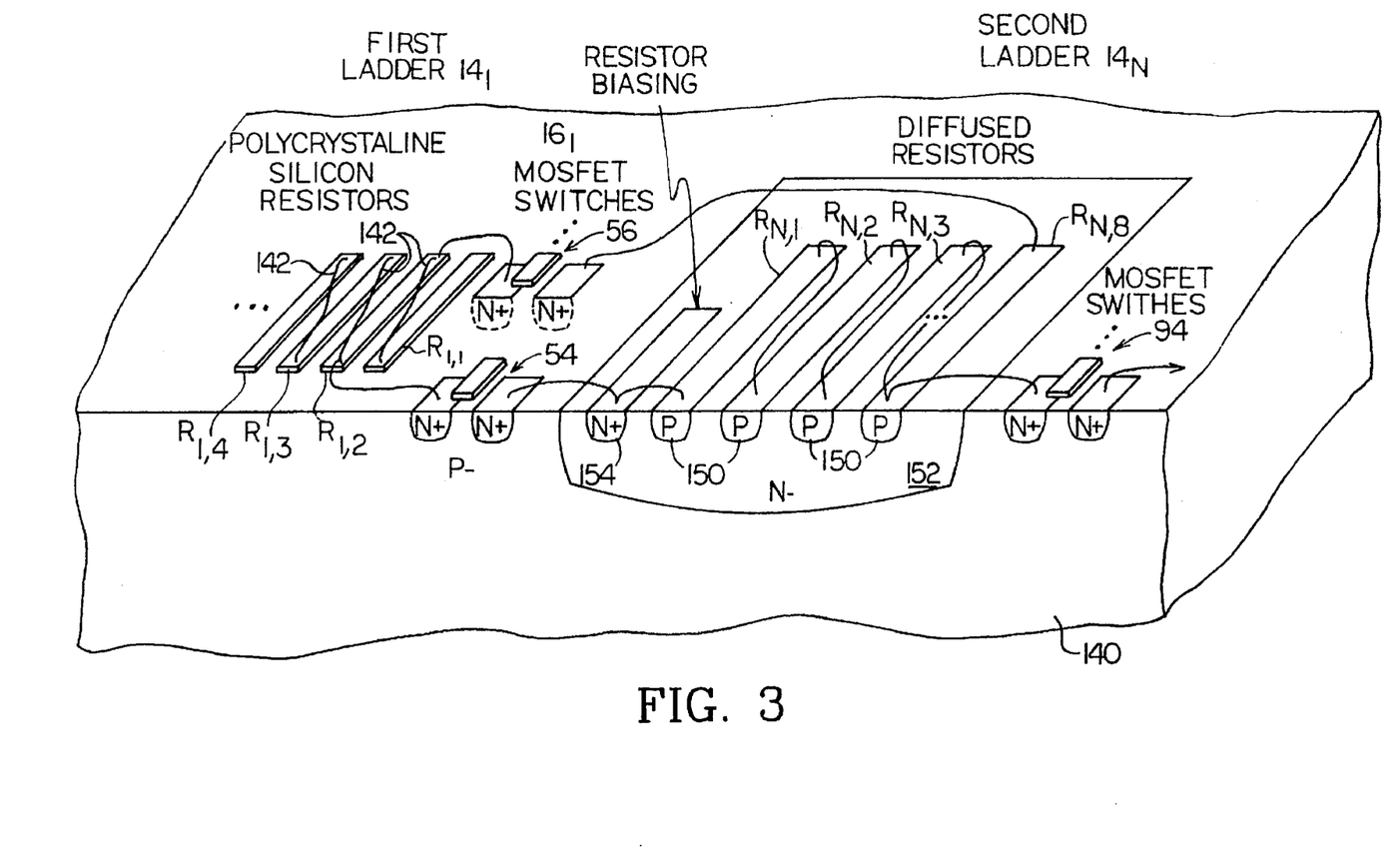
FIG. 3 is a cross-sectional view of a portion of the monolithic digital to analog converter of FIG. 2.

In order to increase the speed of the converter, each of the resistors of a given stage is biased to a common substrate, as represented by biasing path 130 and discussed in conjunction with FIG. 3. Suffice it here to say that with this arrangement, the parasitic capacitances are switched in common mode by a low impedance, thereby minimizing the effect of distributed RC time constants on the settling time of the converter. More particularly, the common resistor biasing scheme avoids conversion speed reduction caused by charging and discharging the parasitic capacitances every time a bit of the digital word changes. It is noted that while the resistors of the first stage have parasitic capacitance associated therewith (not shown), common biasing of the resistors of the first stage $12_1$ is unnecessary since the resistor divider $14_1$ of the first stage $12_1$ is coupled across a constant supply voltage. Moreover, the polycrystalline silicon resistors of the first resistor divider $14_1$, fabricated in the same manner as MOSFET gate electrodes, have very low parasitic capacitance.

Referring to FIG. 3, a cross-sectional view of a portion of the integrated circuit converter of FIG. 2 is shown. The IC includes a P- substrate 140 over which the polycrystalline silicon resistors $R_{1,1}$–$R_{1,8}$ of the resistor ladder $14_1$ of the first stage $12_1$ are formed. Only four $R_{1,1}$–$R_{1,4}$ of the eight polycrystalline silicon resistors $R_{1,1}$–$R_{1,8}$ are shown for clarity. Polycrystalline silicon is advantageous for use in fabricating the resistors of the first stage $12_1$ since such resistors have low bulk resistivity and thus, provide accurate low resistance devices. Conductors 142 interconnect the resistors of the first ladder $14_1$ in series (as shown for exemplary resistors $R_{1,1}$–$R_{1,4}$) and further interconnect each of the resistors to the corresponding switches (as shown for exemplary resistor $R_{1,2}$ coupled to FET switches 54, 56).

The resistors of the subsequent stages $12_2$–$12_N$ are diffusion resistors which are smaller in size than polycrystalline silicon resistors for the same resistance value. As mentioned, the resistors of each stage have resistance values greater than the resistors of the preceding stage, rendering the smaller size of the diffusion resistors particularly advantageous. That is, use of diffusion resistors permits the fabrication of larger resistance devices without requiring significant die area.

Diffusion resistors have, in addition to a parasitic capacitance associated therewith, an inherent diode, as shown in FIG. 2 for resistors $R_{N,1}$–$R_{N,8}$. The present biasing scheme utilizes the inherent diode associated with the diffusion resistors to commonly bias the resistors of each stage to the potential of the top input node of such stage. More particularly, each of the diffusion resistors comprises a P-type doped region of silicon 150 disposed in an N-well 152 with like regions 150 associated with the other resistors of the same ladder. For example, each of the illustrated P-type regions 150 provides one of the resistors of the second and last stage $12_N$ in the illustrative embodiment of FIG. 2. The inherent diode is disposed between the P-type regions 150 and the adjacent N-well 152. Also shown is an exemplary one 94 of the transistor switches 82–96 coupled between the resistor ladder $14_N$ of the Nth stage $12_N$ and the output node 24 (FIG. 2).

The common biasing described above is achieved by providing an N+ contact 154 in the N-well 152, as shown. The N+ contact 154 is connected to FET 54 for biasing of the contact 154 to the potential of the top output node 20a of the preceding stage $12_1$ (FIG. 2). The entire N-well 152 is thus biased to the potential of the top output node 20a (i.e., and interconnected input node 38), thereby causing the parasitic capacitances between the P-type regions 150 and the surrounding N-well 152 to be switched in common mode so that the effect of distributed RC time constants on the setting time of the converter is minimized.

The presence of the inherent diode associated with each of the diffusion resistors results in a preferred bias polarity. Specifically, the N-well 152 is connected to the cathode of the inherent diodes of the diffusion resistors and is preferably connected to the higher potential to reverse bias the diodes. This arrangement minimizes junction current errors and lowers the parasitic capacitances since junction capacitors are voltage dependent and a reverse bias lowers the effective capacitance.

It is noted that although an N-well MOS process is shown, the converter circuit described herein may alternatively be implemented with a P-well or multiple well process. The switches comprising switch ladders $16_1$–$16_N$ may be PMOSFETs, NMOSFETs, or pairs of PMOSFETs and NMOSFETs. In the embodiment of FIGS. 2 and 3, each of the switches 50–96 (FIG. 2) is an NMOS transistor. NMOS transistors are suitable for use in the illustrative embodiment since the reference voltage +$V_{REF}$ is +2.5 V and the logic high output voltage of gates 98–128 is +5.0 V.

Figure 4:
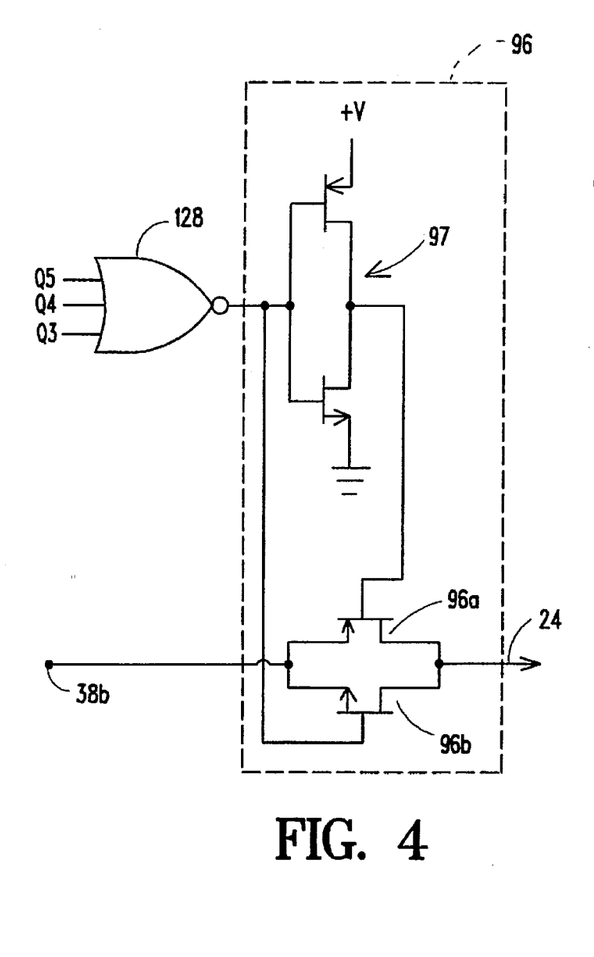
FIG. 4 is a schematic diagram of a portion of the digital to analog converter of FIG. 2 showing an alternate switch embodiment.

Referring to FIG. 4, exemplary switch 96 of FIG. 2 is shown to comprise an NMOSFET 96b and a PMOSFET 96a. Utilizing pairs of PMOS and NMOS FETs coupled in parallel for each of the switches 50–96 is advantageous since such an arrangement is capable of switching both high and low voltages (i.e., with the NMOSFET 96b switching low voltages and the PMOSFET 96a switching high voltages). An inverter 97 is provided to invert the NMOS gate signal for driving the PMOS FET, as shown.

Figure 5:
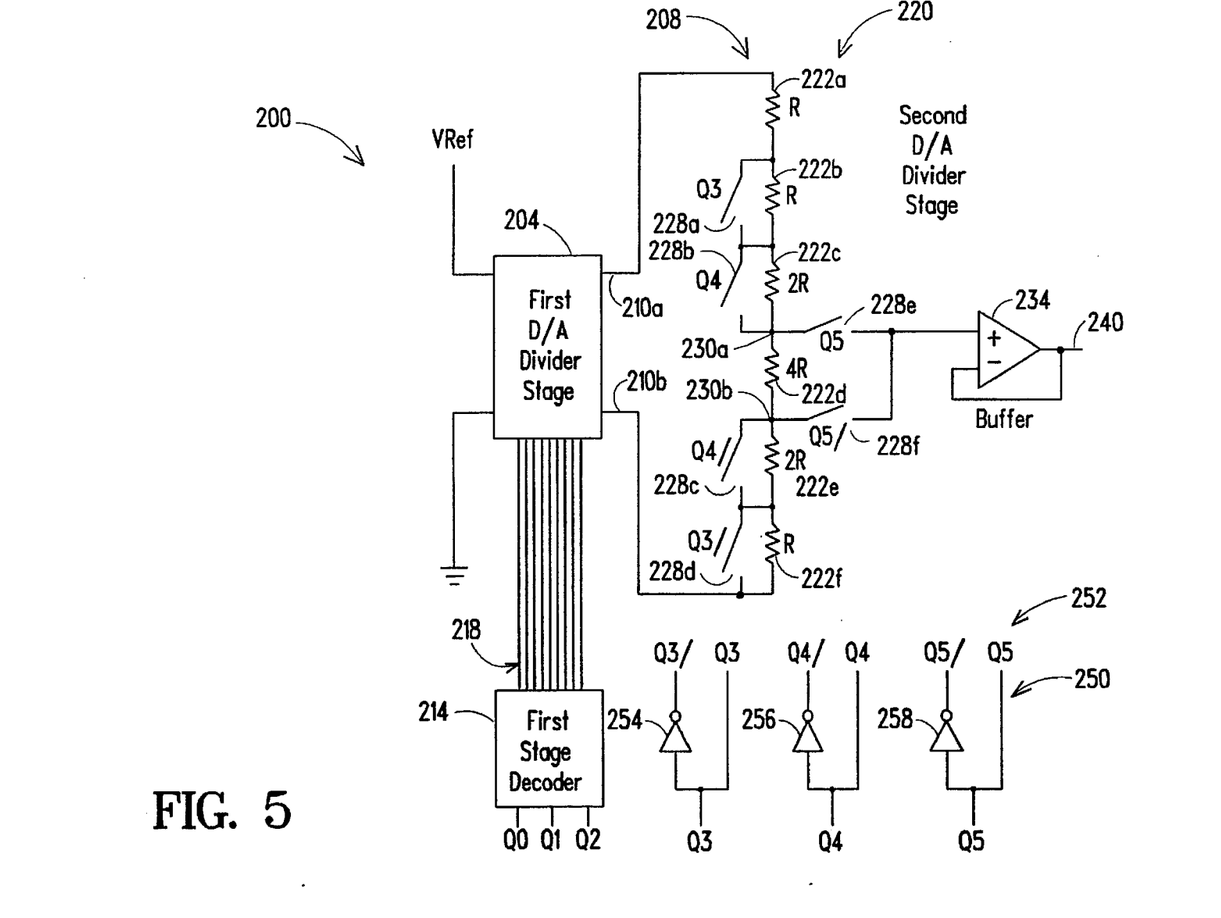
FIG. 5 is a schematic diagram of a digital to analog converter in accordance with a further embodiment of the present invention.

Referring to FIG. 5, a digital to analog converter 200 in accordance with a further embodiment of the invention is shown to include a first stage 204 and a second, last stage 208. It will be appreciated that in certain applications, particularly where the digital word to be converted contains more than six bits, the converter 200 may be readily adapted to have more than the illustrated two stages, by adding one or more intermediate stages between the first stage 204 and the last stage 208. The first stage 204 is identical to the first stage $12_1$ shown in the embodiment of FIG. 1 and thus, includes a resistor ladder $14_1$ comprising a plurality of series-connected resistors $R_{1,1}$–$R_{1,2}{}^4$ coupled across a supply voltage $V_{Ref}$ and ground. The first stage 204 additionally includes a first plurality of switches $16_1$ (FIG. 1) arranged to connect the resistors $14_1$ to a pair of output nodes 210a, 210b of the first stage 204 (similar to nodes 20a, 20b of FIG. 1).

A first stage decoder 214 is responsive to the most significant bits Q0, Q1, and Q2 of the digital word to be converted and generates a first plurality of switch control signals 218 for controlling the first plurality of switches $16_1$ of the first stage 204 which interconnect the resistors of the first stage 204 to output nodes 210a, 210b. More particularly, decoder 214 includes NOR gates (like gates 98–128 shown in FIG. 2), for selectively controlling the first plurality of switches of the first stage 204 in order to provide an analog voltage at nodes 210a, 210b corresponding to the most significant bits Q0, Q1 and Q2 of the digital word to be converted.

The second stage 208 of the digital to analog converter 200 includes a resistor ladder 220 comprising a plurality of resistors 222a, 222b, 222c, 222d, 222e and 222f, all of which are connected in series. The resistor ladder 220 is further connected across the output nodes 210a, 210b of the first stage 204. The resistance values of each of the resistors 222a–222f of ladder 220 are binary weighted with respect to each other. More particularly, in the illustrative embodiment, resistors 222a, 222b and 222f have a resistance value of R=10KΩ, resistors 222c and 222e have resistance values of 2R=20KΩ and resistor 222d has a resistance value of 4R=40KΩ. Note that the weighted resistors may be implemented with multiple series-connected resistors of value R.

The resistance associated with the second stage 208 is greater than the resistance values of the resistors associated with the first stage 204. More particularly, the resistance value of the sum of the resistors of the second stage 208 which are not shorted is greater than the resistance of each of the resistors associated with the first stage 204. With this arrangement, undesirable loading on the preceding stage 204 is prevented, thereby also preventing deterioration of the accuracy of the converter due to loading.

Preferably, the resistors $14_1$ of the first stage 204 are comprised of polycrystalline silicon and the resistors of the last stage 208 are diffusion resistors which provide a higher resistance value than polycrystalline silicon resistors for the same size resistor. The diffusion resistors 222a–222f of the second stage 208 are commonly biased via the inherent diodes associated therewith to a common substrate and, more specifically, to the top input node 210a of the stage. This biasing scheme is like that described above in conjunction with resistors $R_{N,1}$–$R_{N,8}$ in FIGS. 2 and 3. Thus, the same advantage of increasing the speed of the converter is achieved with the present embodiment.

The second stage 208 of the converter 200 additionally includes a second plurality of switches 228a, 228b, 228c, 228d, 228e and 228f. A first portion 228a, 228b, 228c and 228d of the switches 228a–228f are coupled across a respective one 222b, 222c, 222e and 222f of the resistors 222a–222f. The switches 228a–228f may be implemented in the same manner as switch 96, as shown in FIG. 4.

With this arrangement, appropriate control of the switches 228a–228f shorts out selected ones of the resistors 222a–222f, thereby varying the analog voltage level at circuit nodes 230a, 230b. More particularly, switch 228a is responsive to a control signal Q3, switch 228b is responsive to a control signal Q4, switch 228c is responsive to a control signal Q4/, switch 228d is responsive to a control signal Q3/, switch 228e is responsive to a control signal Q5 and switch 228f is responsive to a control signal Q5/.

A second portion 228e and 228f of the switches 228a–228f of the last stage 208 are coupled between the resistor ladder 220 and a non-inverting input terminal of a buffer 234. More particularly, switch 228e has a first terminal connected to node 230a and a second terminal connected to the non-inverting input terminal of buffer 234. Switch 228f has a first terminal connected to node 230b and a second terminal connected to the non-inverting input terminal of buffer 234. The buffer 234 is connected in the manner of a unity gain amplifier to effectively isolate an output terminal 240 of the digital to analog converter, at which the converted analog voltage is provided, from the last stage 208.

A logic circuit 250 is provided for generating a second plurality of switch control signals 252 for controlling the switches 228a–228f of the last stage 208 in response to the least significant bits Q3, Q4, Q5 of the digital word to be converted. To this end, the logic circuit 250 includes three inverters 254, 256 and 258, each one responsive to one of the least significant bits Q3, Q4 and Q5. Thus, the logic circuit 250 provides switch control signals Q3, Q3/, Q4, Q4/, Q5 and Q5/, as shown, to switches 228a, 228d, 228b, 228c, 228e and 228f, respectively, where control signal Q3/is an inverted version of control signal Q3, control signal Q4/is an inverted version of control signal Q4 and control signal Q5/is an inverted version of control signal Q5.

To illustrate the operation of the converter 200, consider the case where the first stage 204 is identical to the first stage $12_1$ in FIG. 1, the digital word to be converted is 100010 and the reference voltage $V_{Ref}$ is 2.5 volts. As described above in conjunction with FIG. 1, with Q0=1, Q1=0 and Q2=0, the voltage at the output nodes 210a, 210b of the first stage 204 is 1.5625 volts and 1.25 volts, respectively. The second plurality of switch control signals 252 are provided as follows: Q3=0, Q3/=1, Q4=1, Q4/=0, Q5=0 and Q5/=1. With the switch control signals 252 in these logic states, switches 228a, 228c and 228e are open, while switches 228b, 228d and 228f are closed thus causing resistors 222c and 222f to be shorted. The resulting resistor divider of the last stage 208 is thus provided by the series connection of resistors 222a, 222b, 222d and 222e, with the tap from the resistor divider being taken between resistors 222d and 222e (i.e., at switch 228f). With this arrangement, the voltage at the non-inverting input terminal of buffer amplifier 234 is 1.25 V+(0.3125 V×2 R/8 R)=1.328125 volts.

With the converter 200, the cost of the digital to analog converter is reduced, since the decoder associated with the last stage 208 is eliminated. Rather, a relatively inexpensive logic circuit 250 is used to generate the switch control signals Q3, Q3/, Q4, Q4/, Q5 and Q5/ in response to the least significant bits Q3, Q4 and Q5. Although the accuracy of the conversion performed by the binary weighted ladder 220 may be somewhat less than that achieved with the resistor ladders $14_1$–$14_N$ of FIG. 1, the cost advantage is worthwhile in many applications, particularly where the binary weighted ladder is used only for the last stage which converts the least significant bits of the digital word. Moreover, the total resistance associated with the binary weighted divider 220 is greater than that associated with the divider $14_1$ (FIG. 1). Whereas the resistor divider $14_1$ includes eight resistors of value R (i.e., with a total resistance of 8 R), the binary weighted ladder 220 of the last stage 208 includes a total resistance of 11 R. However, since the resistors of the last stage 208 are preferably diffusion resistors which are smaller in size for equal resistance than the polycrystalline silicon resistors of the first stage 204, this increased resistance does not correspond to a concomitantly increased size of the binary weighted ladder.

It is noted that in applications in which the converter 200 includes more than the two illustrated stages 204, 208, the added intermediate stages between the first stage 204 and the last stage 208 may be of the type like the first stage 204, including a resistor ladder having resistors of matched resistance values or alternatively, may be of the type like the last stage 208, having a binary weighted resistor ladder. Preferably, any such intermediate stages are of the type of the first stage 204, since two "taps" (i.e., nodes 230a, 230b) are necessary to provide the output terminal of the binary weighted resistor ladder 220, thereby potentially adding complexity to the circuit.

Having described preferred embodiments of the invention, it will be apparent to one of skill in the art that other embodiments incorporating their concepts may be used. Accordingly, the invention should be limited only by the spirit and scope of the appended claims.

I claim:

1. A digital to analog converter comprising:
    a first resistor ladder comprising a first plurality of resistors coupled in series and having matched resistance values, said first resistor ladder being coupled across a supply voltage;
    a second resistor ladder comprising a second plurality of resistors coupled in series and having binary weighted resistance values, wherein the resistance associated with the second resistor ladder is greater than the resistance value of each of said first plurality of resistors;
    a first plurality of switches coupled between said first resistor ladder and said second resistor ladder; and
    a second plurality of switches including a first portion of switches coupled between said second resistor ladder and an output terminal of said digital to analog converter and a second portion of switches coupled across selected ones of said binary weighted resistors of said second resistor ladder.

2. The digital to analog converter recited in claim 1 further comprising:
    a decoder responsive to the most significant bits of a digital word to be converted for generating a first plurality of switch control signals for controlling said first plurality of switches; and
    a logic circuit responsive to the least significant bits of said digital word for generating a second plurality of switch control signals for controlling said second plurality of switches.

3. The digital to analog converter recited in claim 2 wherein said logic circuit comprises a plurality of inverters.

4. The digital to analog converter recited in claim 1 wherein each resistor of said first resistor ladder is comprised of polycrystalline silicon and each resistor of said second resistor ladder is a diffusion resistor.

5. The digital to analog converter recited in claim 1 wherein each of said second plurality of resistors is biased to a common substrate.

6. A integrated circuit digital to analog converter comprising:
    a first resistor ladder comprising a first plurality of resistors coupled in series, having matched resistance values, and comprising polycrystalline silicon, said first resistor ladder being coupled across a supply voltage;
    a second resistor ladder comprising a second plurality of resistors coupled in series across a pair of input nodes and having binary weighted resistance values, wherein each of said second plurality of resistors is a diffusion resistor and wherein the resistance associated with said second resistor ladder is greater than the resistance value associated with each of said first plurality of resistors;
    a first plurality of switches coupled between said first resistor ladder and said pair of input nodes of said second resistor ladder; and
    a second plurality of switches including a first portion of switches coupled between said second resistor ladder and an output terminal of said digital to analog converter and a second portion of switches coupled across selected ones of said binary weighted resistors of said second resistor ladder capable of shorting said selected ones of said binary weighted resistors.

7. The converter recited in claim 6 further comprising a decoder for controlling said first plurality of switches in accordance with the most significant bits of a digital word to be converted.

8. The converter recited in claim 7 further comprising a logic circuit for controlling said second plurality of switches in accordance with the least significant bits of said digital word.

9. The converter recited in claim 8 wherein said logic circuit comprises a plurality of inverters.

10. The converter recited in claim 6 wherein each of said diffusion resistors comprises a doped silicon region disposed in a common well, wherein said well is biased to the potential of one of said input nodes of said second resistor ladder.

11. The converter recited in claim 6 wherein each of said first and second plurality of switches comprises a FET.

12. A digital to analog converter comprising:
    a first stage having a pair of input nodes and a pair of output nodes and converting a corresponding plurality of most significant bits of a digital word into an analog voltage, wherein said first stage comprises:
        (a) a first resistor ladder coupled across said pair of input nodes and comprising a plurality of matched resistors; and
        (b) a first plurality of switches coupled between said first resistor ladder and said pair of output nodes and controlled by a first plurality of switch control signals;

a second stage having a pair of input nodes provided by said pair of output nodes of said first stage and a pair of output nodes for converting a corresponding plurality of least significant bits of said digital word into an analog voltage, wherein said second stage comprises:

(a) a second resistor ladder coupled across said pair of input nodes of said second stage and comprising a plurality of binary weighted resistors; and (b) a second plurality of switches including a first portion of switches coupled between said second resistor ladder and said pair of output nodes of said second stage and a second portion of switches coupled across selected ones of said binary weighted resistors of said second resistor ladder, wherein said second plurality of switches are controlled by a second plurality of switch control signals;

a decoder responsive to said most significant bits of said digital word for providing said first plurality of switch control signals; and a logic circuit responsive to said least significant bits of said digital word for providing said second plurality of switch control signals.

13. The digital to analog converter recited in claim 12 wherein said logic circuit comprises a plurality of inverters.

14. The digital to analog converter recited in claim 12 wherein each of said second plurality of resistors comprising said second resistor ladder is biased to a common substrate coupled to one of said pair of input nodes of said second stage.

* * * * *